United States Patent [19]

Tihanyi et al.

[11] Patent Number: 5,132,766
[45] Date of Patent: Jul. 21, 1992

[54] BIPOLAR TRANSISTOR ELECTRODE

[75] Inventors: Jenoe Tihanyi, Munich; Christine Fellinger, Unterhaching, both of Fed. Rep. of Germany

[73] Assignee: Siemens Aktiengesellschaft, Berlin and Munich, Fed. Rep. of Germany

[21] Appl. No.: 598,572

[22] Filed: Oct. 16, 1990

Related U.S. Application Data

[63] Continuation of Ser. No. 260,432, Oct. 20, 1988, abandoned.

[30] Foreign Application Priority Data

Oct. 21, 1987 [DE] Fed. Rep. of Germany ....... 3735642

[51] Int. Cl.$^5$ ............................................. H01L 29/74
[52] U.S. Cl. .................................. 357/38; 357/23.4; 357/39; 357/43; 357/67
[58] Field of Search ................. 357/43, 38, 39, 34, 357/71 S, 23.1, 23.4, 675

[56] References Cited

U.S. PATENT DOCUMENTS

| | | | |
|---|---|---|---|
| 2,802,759 | 8/1957 | Moles | 148/1.5 |
| 3,634,739 | 1/1972 | Borchert et al. | 357/86 |
| 4,495,513 | 1/1985 | Descamps | 357/43 |
| 4,587,713 | 5/1986 | Goodman | 357/43 |
| 4,618,872 | 10/1986 | Baliga | 357/38 |
| 4,630,084 | 12/1986 | Tihanyi | 357/38 |
| 4,672,407 | 6/1987 | Nakagawa et al. | 357/43 |
| 4,701,424 | 10/1987 | Mikkor | 357/26 |
| 4,782,379 | 11/1988 | Baliga | 357/38 |
| 4,816,892 | 3/1989 | Temple | 357/38 |
| 4,841,345 | 6/1989 | Majumdar | 357/38 |
| 4,851,888 | 7/1989 | Ueno | 357/38 |
| 4,893,165 | 1/1990 | Miller et al. | 357/43 |
| 4,947,219 | 8/1990 | Boehm | 357/15 |
| 4,962,415 | 10/1990 | Yamamoto et al. | 357/72 |
| 4,969,027 | 11/1990 | Baliga et al. | 357/23.4 |
| 4,969,028 | 11/1990 | Baliga et al. | 357/23.4 |
| 4,990,978 | 2/1991 | Kondoh | 357/38 |
| 5,014,102 | 5/1991 | Adler | 357/38 |

OTHER PUBLICATIONS

Wheatley et al., "COMFET—The Ultimate Power Device: A General Study of Power Devices", Solid State Technology, Nov. 1985, pp. 121-128.
"Power Control", Electronic Design, Jan. 12, 1984, pp. 248-250.
Kitahiro, "Manufacture of Semiconductor Device", Pat. Pub. No.: 58-106825, Jun. 25, 1983, Patent Abstracts of Japan, vol. 7, #214, p. 1359.

Primary Examiner—Rolf Hille
Assistant Examiner—Minhloan Tran
Attorney, Agent, or Firm—Joseph S. Codispoti

[57] ABSTRACT

A bipolar transistor is disclosed including a semiconductor body having a cathode-side surface and an anode-side surface, and at least one insulated gate electrode. The semiconductor body has a central region with a predetermined doping concentration and of a first conductivity type. The central region borders on the cathode-side surface of the semiconductor body. Bordering on the cathode-side surface, at least one gate region is provided which borders on the central region. The gate region is of the second conductivity type and has a higher doping concentration than the central region. In the gate region, a source region is provided which borders on the cathode-side surface. The gate electrode is seated on an insulating layer applied on the cathode-side surface and covers the gate region. Between the anode-side surface and the central region is provided an anode region of the second conductivity type which has a higher doping concentration than the central region. Between gate region and source region, a shunt is provided. The anode region is a recrystallized region of a metal silicon alloy doped with a doping substance.

1 Claim, 1 Drawing Sheet

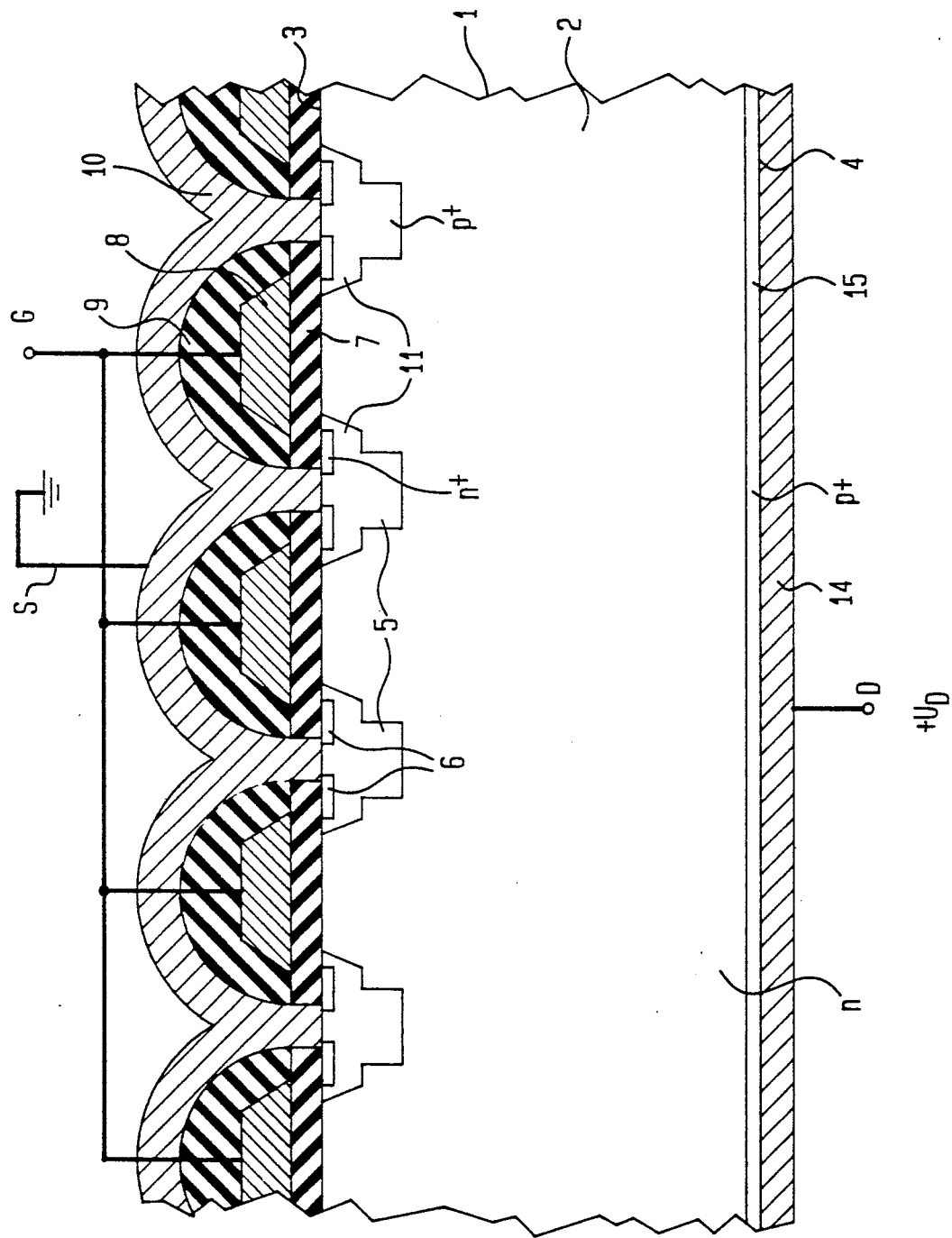

BIPOLAR TRANSISTOR ELECTRODE

CROSS-REFERENCE TO RELATED APPLICATION

This is a continuation of Ser. No. 07/260,432 filed Oct. 20, 1988, now abandoned.

BACKGROUND OF THE INVENTION

The present invention relates to a bipolar transistor, including a semiconductor body having a cathode-side surface and an anode-side surface, and at least one insulated gate electrode. The transistor has the following features. The semiconductor body has a central region with a predetermined doping concentration and of a first conductivity type. The central region borders on the cathode-side surface of the semiconductor body. Bordering on the cathode-side surface, at least one gate region is provided which borders on the central region. The gate region is of the second conductivity type and has a higher doping concentration than the central region. In the gate region, a source region is provided which borders on the cathode-side surface. The gate electrode is seated on an insulating layer applied on the cathode-side surface and covers the gate region. Between the anode-side surface and the central region is provided an anode region of the second conductivity type which has a higher doping concentration than the central region. Between gate region and source region, a shunt is provided.

Such a semiconductor structural element has been described, for example, in the article "COMFET-The Ultimate Power Device" in the journal Solid State Technology, November 1985, pages 121 to 128. On the cathode side it is structured like a power MOSFET, however, on the anode side it has a region which is of the opposite type of conductivity from the central region. Consequently, it has a thyristor structure and is provided on the cathode side with a shunt which increases the so-called latching current known from the thyristor in such a way that it is not reached during operating conditions of the structural element. Both types of charge carriers participate in current transport, as is the case with the thyristor but in contrast to the power MOSFET. On the one hand, this has the advantage of a low conducting state dc resistance but does, on the other hand, have the disadvantage of a storage charge which delays switching off.

The storage charge was diminished according to different suggestions, for example, by introducing substances forming recombination centers or through disturbance sites generated by irradiation. A further suggestion is that between the central region and the anode region a buffer region is inserted which is of the same type of conductivity as the central region, but has a higher doping concentration. See, for example, the article "Power Control" in the journal Electronic Design, Jan. 12, 1984, pages 248 and 249.

With the described measures, or with a combination of both measures, a reduction of the storage charge, and with it a reduction of the switch-off time, can be achieved. It is the goal of the invention to achieve, with simple means, a further decrease of the storage charge and a shortening of the switch-off time.

SUMMARY OF THE INVENTION

This goal is achieved by fabricating the anode region from a recrystallized region of a metal silicon alloy doped with a doping substance.

BRIEF DESCRIPTION OF THE DRAWINGS

The invention is explained with reference to an embodiment example in connection with the Figure which shows a section through the described embodiment example.

DESCRIPTION OF THE PREFERRED EMBODIMENT

In the Figure, a bipolar transistor has a semiconductor body 1 with an n-doped central region 2. The doping may be, for example, at a concentration of from 1 to $2 \times 10 \text{-cm}^{-3}$. The semiconductor body 1 has a cathode-side surface 3 and an anode-side surface 4. The central region 2 reaches to the cathode-side surface 3. Bordering on the cathode-side surface 3, gate regions 5 are embedded which are strongly p-doped. In each of the gate regions, a strongly n-doped source region 6 is embedded. Its doping is stronger than that of gate regions 5. On the cathode-side surface 3, an insulating layer 7 is provided on which are located gate electrodes 8, connected in parallel to each other. The gate electrodes 8 cover a part of the gate regions 5 emerging to the cathode-side surface 3 at the channel regions 11, i.e. at those sites at which a channel is to form between the source regions 6 and the central region 2. The gate electrodes 8 are covered by a further insulating layer 9. In the insulating layers 7 and 9, openings are provided through which the source regions 6 and the gate regions 5 are bonded to a metal layer 10 which resides on the insulating layer 9. The metal layer preferably consists of aluminum. Bonding of regions 5 and 6 through metal layer 10 represents a strong shunt.

Between the central region 2 and the anode-side surface 4 is a strongly p-doped layer 15. This layer is silicon which is recrystallized from a gold silicon eutectic 14. It contains, as a doping substance, for example, boron. The gold silicon eutectic 14 remaining after cooling and recrystallization forms the anode electrode. By conducting the process appropriately, layer 15 can be made very thin during manufacture, for example 1/10 μm.

Because of the thin p+ region 15, the carrier storage charge, stored primarily in the central region 2, can be drastically reduced. The finding was applied that the storage charge, in a first approximation, is given by the following formula:

$$Q = \frac{N_{Ap}}{N_{Dn}} \cdot W_p \cdot I \cdot A \cdot K \quad (1)$$

where $N_{Ap}$ and $N_{Dn}$ are the net acceptor concentration in the recrystallized layer 15, and the net donor concentration in the central region 2, respectively; $W_p$ the thickness of the recrystallized layer 15; I the current; A the area of the semiconductor body 1, and K a constant. The constant K is determined, also as a first approximation, to be:

$$K = \frac{3}{2} \cdot \frac{1}{D_n q} \cdot W_n \quad (2)$$

where $D_n$ is the diffusion constant in central region 2, q the elemental electronic charge, and $W_n$ the thickness of central region 2.

It is clear that the value $W_P$ enters linearly into the storage charge. The storage charge is additionally determined by the ratio of the net doping concentrations. This ratio is, as is known, set so that satisfactory conducting state properties of the bipolar transistor are obtained.

A preferred method for the manufacture of the bipolar transistor is: into an n-doped wafer of, for example, 600 82 m thickness, the gate regions 5 and source regions 6 are introduced in known manner. Production of the insulating layers 7 and 9, the gate electrodes 8 and the metal layer 10 likewise takes place in the manner known from the manufacture of power MOSFETs. After the transistor is completed on the cathode side, the thickness of the semiconductor body can be reduced by grinding or sand blasting or a similar method from the anode side to a thickness which is approximately two to three times greater than the width of the space charge region for the intended inverse voltage class, for example 200 to 300 μm. Subsequently the layer disturbed through mechanical working is removed by etching. A part of the layer may be retained, since the disturbance sites generated by being worked act as recombination centers. Subsequently, into the anode-side surface, a doping substance, for example boron, is implanted. This can take place at a concentration, for example, of $5 \times 10^{14}$ cm$^{-3}$ and at an energy of 80 keV. Now, for example, pure gold at a thickness of 0.1 μm is deposited on the anode-side surface. Upon subsequent heating of the wafer, for example to 400° C. for a period of 30 minutes, a gold silicon eutectic layer forms which contains boron ions. If the wafer is cooled again after the formation of a sufficiently thick eutectic layer, for example within 10 minutes, the layer 15, which consists of silicon with included boron ions, bordering on the central region 2, recrystallizes again. The rest of the gold silicon eutectic layer 14 can be used as a contact electrode. This can be adhered to a support body, or, after application of additional metal layers, for example TiNiAg, can be soldered.

The generation of doped regions by way of forming an alloy via a gold silicon eutectic is known. Instead of pure gold, for example, a germanium gold alloy can be used. It is also possible to vapor deposit an aluminum layer, instead of the gold, upon the implanted boron ions, which is then, in known manner, alloyed in. However, alloying should preferably take place with a metal or an alloy whose eutectic temperature is lower than that temperature which would disturb the structures fabricated on the cathode side. The metal layer 10, which customarily consists of aluminum, is particularly sensitive. The eutectic temperature of gold silicon lies below this temperature.

In such a bipolar transistor with an inductive load at a voltage of 600 V and 15 A load current, a switch-off time of less than 100 ns may be achieved. The switch-off time is measured, as usual, as that time which passes between the drop of the current from 90% to 10%.

A further advantage of the invention is that the semiconductor body 1 does not need to be an expensive epitaxy wafer, but instead need only be inexpensive semiconductor basic material. The given doping concentration of from 1 to $2 \times 10^{14}$ cm$^{-3}$ can be produced simply with the known and customary zone melting without additional doping steps being required on the basic body.

The invention has been described with reference to an embodiment example which has a multiplicity of electrically parallel connected gate regions, source regions and gate electrodes. But it is also possible to apply the invention to a transistor which only has one finger-shaped gate region, source region and gate electrode each.

It is also not absolutely required to form a metal silicon eutectic or to use metals which form a eutectic with silicon. What is essential is that the recrystallized layer contains atoms of the doping substance.

What we claim is:

1. A bipolar transistor including a semiconductor body having a cathode-side surface and an anode-side surface, and at least one insulated gate electrode, said transistor having the features:
   a) the semiconductor body has a central region with a predetermined doping concentration and of a first conductivity type;
   b) the central region borders on the cathode-side surface of the semiconductor body;
   c) bordering on the cathode-side surface, at least one gate region is provided which borders on the central region;
   d) the gate region is of a second conductivity type and has a higher doping concentration than the central region;
   e) in the gate region, a source region is provided with borders on the cathode-side surface;
   f) the gate electrode is seated on an insulated layer applied on the cathode-side surface and covers the gate region;
   g) between the anode-side surface and the central region is provided an anode region of the second conductivity type which has a higher doping concentration than the central region;
   h) between gate region and source region, a shunt is provided;
   i) the anode region is a recrystallized region of a metal silicon alloy doped with a doping substance and has a thickness of about 0.1 micrometers; and
   j) an anode electrode comprising a metal silicon compound.

* * * * *